(12) United States Patent
Pesola

(10) Patent No.: US 6,374,093 B1
(45) Date of Patent: Apr. 16, 2002

(54) SHIFTING OF FREQUENCY RANGE AND BANDWIDTH OF RECEIVERS USING A MIXER ATTENUATING THE IMAGE FREQUENCY

(75) Inventor: Mikko Pesola, Märynummi (FI)

(73) Assignee: Nokia Mobile Phones Ltd., Salo (FI)

( * ) Notice: Subject to any disclaimer, the term of this patent is extended or adjusted under 35 U.S.C. 154(b) by 0 days.

(21) Appl. No.: 08/330,972

(22) Filed: Oct. 28, 1994

(30) Foreign Application Priority Data

Nov. 1, 1993 (FI) .................................................. 934832

(51) Int. Cl.[7] .................................................. H04B 1/18
(52) U.S. Cl. ..................... 455/188.1; 455/266; 455/302
(58) Field of Search .......................... 455/3.2, 59, 142, 455/143, 179.1, 180.1, 188.1, 189.1, 190.1, 302, 266, 307, 313, 314, 315, 339, 552, 553

(56) References Cited

U.S. PATENT DOCUMENTS

| | | | |
|---|---|---|---|
| 4,115,737 A | * | 9/1978 | Hongu et al. ............... 455/302 |
| 4,207,532 A | * | 6/1980 | Perlich ........................ 455/339 |
| 5,214,796 A | | 5/1993 | Gorrie et al. ............... 455/326 |
| 5,369,800 A | * | 11/1994 | Takagi et al. ................. 455/59 |
| 5,437,051 A | * | 7/1995 | Ofo ............................. 455/143 |

FOREIGN PATENT DOCUMENTS

| | | |
|---|---|---|
| EP | 0 322 612 A3 | 7/1989 |
| EP | 0443 668 A3 | 8/1991 |
| GB | 1 550 695 | 8/1979 |
| JP | 0138819 | * 6/1988 ............... 455/180.1 |

OTHER PUBLICATIONS

RF Design, vol. 16, No. 4, Apr. 1993, Englewood, US, pp. –29–38,MAGIN 'A Robust Signaling Technique for Part 15 RF Control Network Applications'.

* cited by examiner

Primary Examiner—Thanh Cong Le
(74) Attorney, Agent, or Firm—Perman & Green, LLP

(57) ABSTRACT

The circuit arrangement utilizes both outputs of a mixer attenuating the image frequency, whereby one of the desired frequency bands is obtained from a "signal port" and the other desired frequency band from the "port of the image signal". Thus a desired intermediate frequency signal band (IF) corresponding to the radio frequency Input signal (RF) can be selected using a switch (24), the intermediate frequency signal band (IF) being filtered by an intermediate frequency filter (20, 22). The frequency (LO) of the local oscillator is selected to be in the middle of the radio bands (RF).

13 Claims, 1 Drawing Sheet

SHIFTING OF FREQUENCY RANGE AND BANDWIDTH OF RECEIVERS USING A MIXER ATTENUATING THE IMAGE FREQUENCY

BACKGROUND OF THE INVENTION

Various methods are used in radio communications systems for duplex operations. Conventional analog systems generally employ Frequency Division Duplex (FDD). Two different frequency bands are used; one for reception and one for transmission.

Time Division Duplex (TDD) is viable In digital systems. For example, the DECT system (Digital European Cordless Telecommunications) uses TDD. In this case the transmitter (Tx) and the receiver (Rx) operate on the same frequency band, only in different time slots.

In some future telecommunications systems such as the UMTS (Universal Mobile Telecommunication System) the system may have to be able to switch from the FDD state into the TDD state and vice versa. Two FDD bands would most likely be used in actual systems, the one upwards (uplink) to the base station and the other one downwards (downlink) from the base station to a mobile phone, for instance, and a third frequency band for TDD operations. Thus both the receiver and the transmitter must switch their operating frequencies when the radio part is coupled from the FDD state to the TDD state and vice versa. In the intermediate frequency a different bandwidth is typically used in the FDD state than in the TDD state. This means that the receiver must also switch the bandwidth of the intermediate frequency at the same time as the band of the operating frequency Is switched.

Where the receiver must switch its operating frequency band between two frequency bands, the changing over can be carried out by switching the frequency of the local oscillator. At the same time, the passband of the bandpass filter of radio frequency preceding the mixer should be switched so that it passes the right frequency band. Alternatively, two bandpass filters can be used, one of which is respectively coupled to the signal route using two switches. The switching of the frequency of the local oscillator can be considerable and it is not easy to implement using the same synthesizer. On the other hand, using two switchable synthesizers in the local oscillator is a far more complicated task.

The switch of the bandwidth of the intermediate frequency is normally carried out using two filters and two switches through which the required filter is coupled to the signal route. Alternatively, filters with different bandwidths can be coupled in series, as disclosed in U.S. Pat. No. 4,385,402.

An image reject mixer comprises a 3 dB radio frequency hybrid coupler with a 90 degree phase switch, an inphase power divider of the local oscillators, two mixers, and a 3 dB Intermediate frequency hybrid. The desired signal is summed inphasally in the intermediate frequency hybrid to another intermediate frequency output port and cancelled in the other Intermediate frequency output port. In the same way, the image signal is summed in the one port and cancelled in the port in which the desired signal is summed. Generally the port of the image signal is terminated and the port of the desired signal Is used as the Intermediate frequency output port.

FIG. 1 shows schematically a circuit arrangement according to prior art which can be used to switch the frequency of a receiver and which was described in a general way at the beginning. A radio frequency signal RF coming from an antenna (not shown), for instance, is directed to a bandpass filter (RF filter), and further into a mixer to be mixed by the frequency LO of the local oscillator, from where the intermediate frequency signal is directed to an intermediate frequency filter (IF filter), and from there to the output as a desired intermediate frequency output signal IF. The medium frequency of the intermediate frequency signal directed to the output can be switched by switching frequency LO of the local oscillator. However, also the RF and IF filters must then be switched so that they pass the desired band, respectively. Therefore, the RF and IF filters of FIG. 1 are duplicated. The frequency switching is carried out in the case of FIG. 1 by switches s1–s4 which are used to couple the desired RF filter and IF filter, respectively, to route RF–IF. The properties of the bandpass filters (RF, IF), i.e., the medium frequency and bandwidth are dimensioned in accordance with respective requirements in a manner known per se. As previously mentioned, the frequency switching of the local oscillator may lead to problems in practice.

SUMMARY OF THE INVENTION

In accordance with a first aspect of the present invention there is provided a circuit arrangement for switching the frequency range of a radio receiver, utilizing image frequency bands, whereby the frequency of a local oscillator Is adapted approximately to the middle of two selected frequency bands, characterised In that the circuit arrangement comprises
- a mixer attenuating the image frequency, an intermediate frequency corresponding to the first frequency band being obtained from the first output of the mixer, and an intermediate frequency corresponding to the second frequency band being obtained from the second output, and
- a switch for selecting a desired intermediate frequency corresponding to the frequency band either from the first or the second output of the mixer.

In accordance with a second aspect of the present Invention there is provided a circuit for switching the frequency range of a radio receiver between first and second frequency bands comprising:
- means for providing a local oscillator or signal having a frequency between the first and second frequency bands;
- means for mixing the local oscillator signal and a received signal to provide an output signal;
- means for providing the output signal to a first output if the received signal is within the first frequency band and to a second output if the received signal is within the second frequency band; and
- means for selecting the first and second output depending on the frequency band of the received signal.

The invention utilizes a circuit that could be used as an image rejection frequency converter to provide output signals down converted from a first frequency band to a first output and output signals down converted from a second frequency band to a second output, providing a simple arrangement for switching the frequency range of a radio receiver.

The Invention provides a circuit arrangement utilizing the image frequency bands for switching the frequency and bandwidth of the receiver, which can be used to simplify the circuit structure compared to prior art.

The circuit arrangement according to the Invention utilizes both outputs of a mixer which attenuates the image frequency, whereby one of the desired frequency bands is obtained from the "signal port" and the other desired frequency band from "the port of the image signal" which is generally not utilized in prior art image rejection frequency converters.

The invention Is described in the following with the aid of the drawings in which:

DETAILED DESCRIPTION OF THE DRAWINGS

Figure 2:
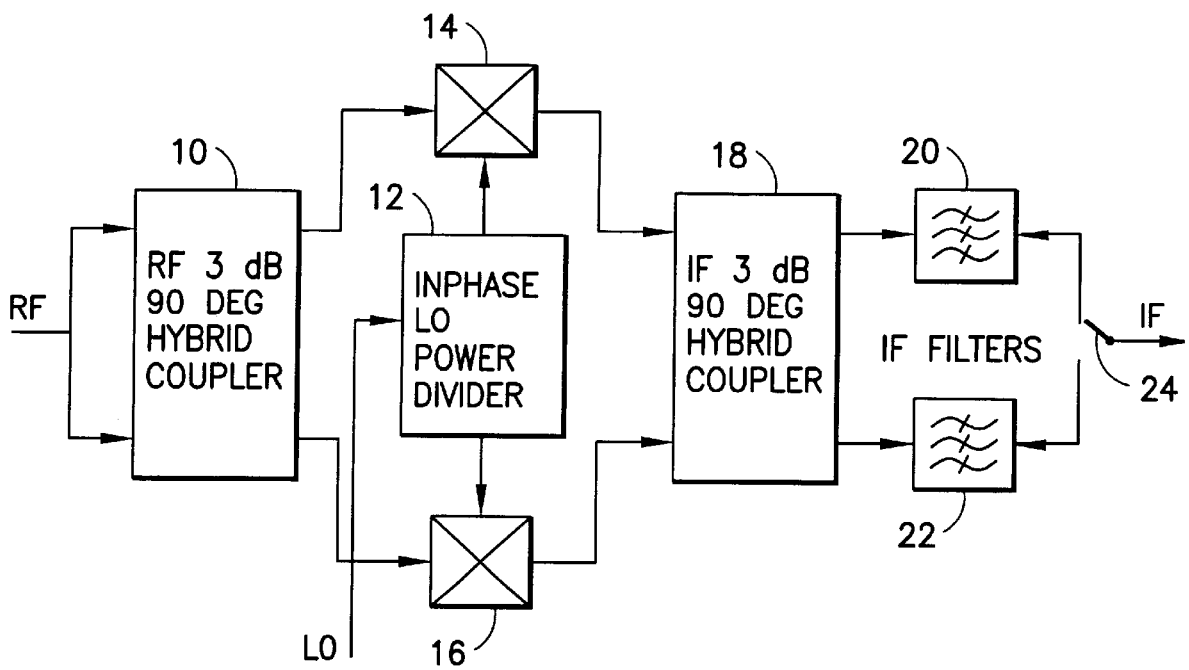
FIG. 2 shows schematically a circuit solution according to the invention for switching the frequency and the bandwidth of the receiver.

FIG. 2 shows a circuit arrangement according to the invention which can be used for switching the frequency and bandwidth in the simplest way. The circuit arrangement comprises:

a radio frequency 3 dB hybrid coupler 1 (RF hybrid) with a 90 degree phase shift, comprising as its output the radio frequency signal RF from, for instance, an antenna;

inphasal power divider 12 of output signal LO of a local oscillator (not shown), the outputs of the power divider being directed to the mixers;

two mixers 14, 16, the outputs of which are directed to the respective input of the intermediate frequency hybrid;

a 3 dB intermediate frequency hybrid coupler 18 (IF hybrid) with a 90 degree phase shift, the outputs of the hybrid being directed to the respective intermediate frequency filter;

bandpass filters 20, 22, of the intermediate frequency, the outputs of which are directed to a selector switch; and selector switch 24 which is used to select a desired outcoming intermediate frequency as output IF.

Figure 3:
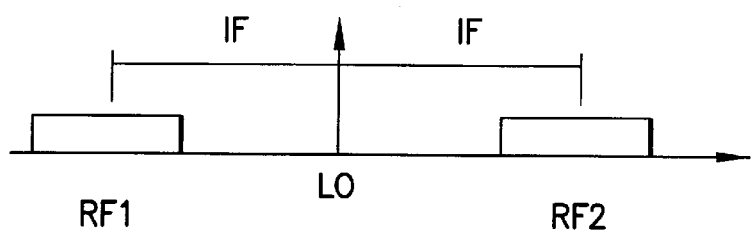
FIG. 3 shows, on a frequency axis, the placement of the local oscillator of the receiver approximately in the middle of the radio frequency bands coming into the receiver.

The circuit arrangement in FIG. 2 utilizes both outputs of the mixer attenuating the image frequency, whereby one of the desired frequency bands is obtained from a "signal port" and the other desired frequency band from "the port of the image signal". Thus the frequency of the local oscillator must be selected so that It is approximately halfway between the desired frequency bands. On the other hand, intermediate frequency IF must also consist of approximately half of the difference between the medium frequency of the two selected frequency bands. This situation is schematically illustrated in FIG. 3 where the selected radio frequency bands are marked with RF1, RF2. In this way no major changes need to be carried out on the selected frequencies in frequency LO of the local oscillator, as the other selected intermediate frequency IF is switched to the output. Consequently, the selection of the bands can also be carried out using either one of the outputs of the mixer attenuating the image frequency.

Figure 1:
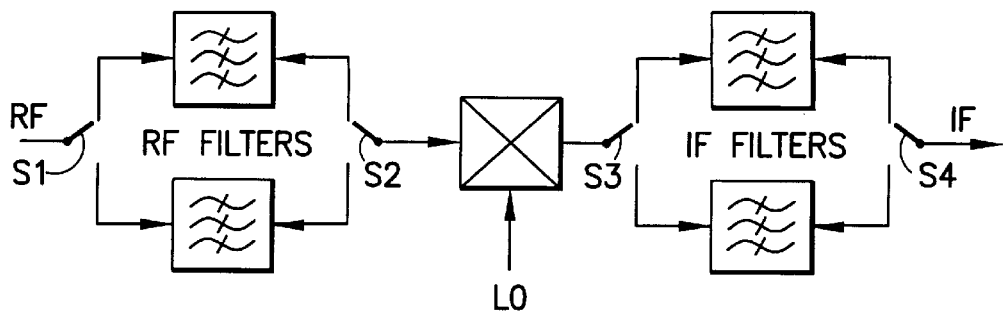
FIG. 1 shows schematically a circuit arrangement according to prior art.

Since the bandwidth of the intermediate frequency may change while the frequency is switched, two different intermediate frequency filters 20 and 22, respectively, can be coupled to the outputs of the mixer without using any switches. The advantage of this arrangement is that no switches are required before the filters, and therefore the fitting between the filter and mixer 18 can be optimized separately for each filter 20, 22. In fact, as compared with FIG. 1, only one switch 24 is required for the circuit arrangement of the invention instead of four switches s1–s4, which significantly simplifies the circuit design.

Frequency LO of the local oscillator can be advantageously so selected that it is exactly in the middle of frequency bands RF1, RF2. Alternatively, frequency LO of the local oscillator can be so selected that it is not exactly in the middle of the bands but tuned to the side to given degree Df, in either direction. In the latter case frequency LO of the local oscillator must be switched to degree Df when changing the frequency band (RF1, RF2) directed to output IF. However, this frequency switch Df is considerably lower than in the case of FIG. 1, for instance, where no mixer attenuating the image frequency is used. Consequently, in the case of FIG. 2, both frequencies (LO; LO+Df or LO−Df) can be implemented in the local oscillator using the same synthesizer.

A system which comprises several frequency channels in frequency bands 2000–2050 MHz and 2200–2250 MHz can be mentioned as an example. Half of the differences of the medium waves of the radio bands, i.e., (2200+2250)/2−(2050+2000)/2=100 MHz, can be selected as the intermediate frequency. Thus frequency LO of the signal of the local oscillator varies between 2100–2150 MHz depending on the channel. A 100 MHz intermediate frequency is obtained from both the signal port of the mixer and from the image frequency port so that the signal of one of the ports corresponds to a lower frequency band and the signal of the other port to a higher frequency band. An intermediate frequency filter (such as the higher one of the intermediate frequency filters, IF filters, in FIG. 2) with a narrower band, such as 100 kHz, can be coupled to one of the ports, and an intermediate frequency filter (lower intermediate frequency filter, IF filter, in FIG. 2, for instance) with a wider band, such as 1 MHz, can be coupled to the other port. By selecting a signal from the output of either intermediate frequency filter, it is possible to choose whether to receive a narrow-band signal from the first frequency band or a wide-band signal from the second frequency band.

In some applications the attenuating properties of the mixer attenuating the image frequency (of the transmission frequency) are perhaps not sufficient. In such cases a switchable or tunable RF filter (not shown) can be used before the mixer to attenuate the transmission image frequency, the filter producing a higher attenuation on a selected frequency band.

The invention is advantageously applied in radio telephones and radio telephone systems which were referred to in the introductory part of the description. Naturally, the principle according to the invention can be modified within the scope of the Claims with respect to operating frequencies, bandwidths and structural details of the circuit arrangement. The details of the circuit arrangement with respect to the dimensioning is not disclosed in this description more closely because they are considered to be a part of the normal skills of those skilled in the art, which can be applied after reading this description.

The present invention includes any novel feature or combination of features disclosed herein either explicitly or any generalisation thereof irrespective of whether or not it relates to the claimed invention or mitigates any or all of the problems addressed.

In view of the foregoing description It will be evident that various modifications may be made within the scope of the invention.

What is claimed is:

1. A circuit arrangement for switching the frequency renga of a radio receiver, utilizing image frequency bands, to a desired frequency band selected from between a first frequency band having channels with a first bandwidth and a second frequency band having channels with a second bandwidth, whereby the frequency of a local oscillator is adapted approximately to the middle of the two selected frequency bands, characterised in that the circuit arrangement comprises:

a mixer attenuating the image frequency comprising means to phase-shift a received radio frequency signal, means to mix phase-shifted received radio signal and a local oscillator signal, and means to phase-shift an intermediate frequency signal resulting from the mixing of said phase-shifted received radio signal and said local oscillator signal, said mixer having at least a first output and a second output with an intermediate frequency corresponding to the first frequency band being obtained from the first output of the mixer, and an intermediate frequency corresponding to the second frequency band being obtained from the second output;

a first bandpass filters having a passsband with a width that substantially corresponds to the bandwidth of the channels of the first frequency band, coupled to said first output of said mixer;

a second bandpass filter, having a passsband with a width that differs from said first bandpass filter and substantially corresponds to the bandwidth of the channels of the second frequency band, coupled to said second output of said mixer; and a switch for selecting a desired intermediate frequency corresponding to the desired frequency band either from the output of said first bandpass filter or the output of said second bandpass filter.

2. A circuit arrangement according to claim 1, characterized in that the frequency of the local oscillator is fitted halfway between said first and second frequency bands.

3. A circuit arrangement according to claim 1, characterised In that the frequency of the local oscillator is fitted halfway between two selected frequency bands.

4. A circuit arrangement according to claim 1, characterized in that the frequency of the local oscillator and the parameters of the intermediate frequencies of the mixer outputs are so selected that the intermediate frequencies respectively directed to the output, using the switch, have predetermined bandwidths.

5. A circuit arrangement according to claim 4, characterised in that the predetermined bandwidths are the same.

6. A circuit arrangement according to claim 4, characterised in that the bandwidths are different.

7. A circuit for switching the frequency range of a radio receiver between first and second frequency bands comprising:

means for providing a local oscillator signal having a frequency between the first and second frequency bands;

means for mixing the local oscillator signal and a received RF signal to provide an output signal;

means for providing the output signal to a first output if the received signal is within the first frequency band and to a second output if the received signal is within the second frequency band, wherein said means for mixing and said means for providing the output signal form, in part, a mixer attenuating the image frequency comprising means to phase-shift a radio frequency signal, means to phase-shift an intermediate frequency signal, and means to filter phase-shifted intermediate frequency signals of different bandwidths; and means for selecting the first or the second output as the output of said circuit depending on the frequency band of the received RF signal.

8. A circuit according to claim 7, wherein said mixer attenuating the image frequency further comprises:

a 3 dB radio frequency hybrid coupler with a 90 degree phase shift for receiving said received RF signal and producing a first output signal and a second output signal in accordance therewith;

an inphasal power divider for receiving said signal of the local oscillator and producing a first output signal and a second output signal in accordance therewith;

two mixers, one receiving said first output signals and the other receiving said second output signals from said coupler and divider and each providing a respective output in response thereto;

a 3 dB intermediate frequency hybrid coupler with a 90 degree phase shift for receiving the respective outputs from said two mixers and providing said first and second outputs in response thereto; and bandpass filters respectively coupled to the first and second outputs of the intermediate frequency hybrid coupler and each providing a respective circuit output in response thereto.

9. A circuit according to claim 8 wherein said selecting means comprise a switch coupled to the respective circuit outputs of the bandpass filters, the desired intermediate frequency to be output by said circuit being selected using the switch.

10. A circuit for switching the frequency range of a radio receiver, utilizing image frequency bands, to a desired frequency band selected from between a first frequency band having channels with a first bandwidth and a second frequency band having channels with a second bandwidth, whereby the frequency of a local oscillator is adapted approximately to the middle of two selected frequency bands, said circuit comprising:

mixer means for attenuating the image frequency having a first output and a second output and comprising:

means for receiving and phase-shifting radio frequency signals and producing a first output signal and a second output signal in accordance therewith;

an inphasal power divider for receiving said signal of the local oscillator and producing a third output signal and a fourth output signal in accordance therewith;

two mixers, one receiving said first and third output signals and the other receiving said second and fourth output signals and providing respective sixth and seventh output signals in response thereto;

means, coupled to said sixth and seventh output signals, for phase-shifting intermediate frequency signals and producing eighth and ninth intermediate frequency outputs In accordance respectively with said sixth and seventh output signals, said eighth and ninth intermediate frequency outputs corresponding to an intermediate frequency of the first frequency band being obtained from said first output of said mixer means and an intermediate frequency of the second frequency band being obtained from said second output;

a first bandpass filter having a passband with a width that substantially corresponds to the bandwidth of the channels of the first frequency band and coupled to said first output of said mixer means;

a second bandpass filter having a passsband with a width that differs from said first bandpass filter and substantially corresponds to the bandwidth of the channels of the second frequency band and coupled to said second output of said mixer means; and switch means for selecting a desired intermediate frequency corresponding to the desired frequency band either from the output of said first bandpass filter or the output of said second bandpass filter.

11. A circuit according to claim 10 wherein the frequency of the local oscillator is fitted halfway between said first and second frequency bands.

12. A circuit according to claim 10, wherein the frequency of the local oscillator is fitted slightly aside from the middle of said first and second frequency bands and further comprising means for changing the frequency of the local oscillator to a predefined degree, while at least one of the first and second output frequencies is selected to be output using said switch means.

13. A circuit according to claim 10 further comprising means for selecting the frequency of the local oscillator and the parameters of the intermediate frequency filters of the mixer means' outputs such that the intermediate frequencies respectively directed to be output, using the switch means, have a predetermined bandwidth.

* * * * *

UNITED STATES PATENT AND TRADEMARK OFFICE
CERTIFICATE OF CORRECTION

PATENT NO. : 6,374,093 B1
DATED : April 16, 2002
INVENTOR(S) : Mikko Pesola

It is certified that error appears in the above-identified patent and that said Letters Patent is hereby corrected as shown below:

Column 5,
Line 2, "renga" should read -- range --.
Line 23, "filters" should read -- filter -- and "passsband" should read -- passband --.
Line 27, "passsband" should read -- passband --.
Line 40, after "claim 1," insert -- in which the frequency of the local oscillator is fitted slightly aside from the middle of the two selected frequency bands. --.
Line 41, "In" should read -- in -- and delete "fitted".
Line 42, delete "halfway between two selected frequency bands" and insert -- changed to a redefined degree, while the first and/or second output frequency is selected to the output using said switch. --.

Column 6,
Line 57, "In" should read -- in --.

Column 7,
Line 3, "passsband" should read -- passband --.

Signed and Sealed this

Twenty-sixth Day of November, 2002

Attest:

JAMES E. ROGAN
Attesting Officer
Director of the United States Patent and Trademark Office